United States Patent
Yamada (10) Patent No.: US 11,598,949 B2
(45) Date of Patent: Mar. 7, 2023

(54) ACTUATOR AND LIGHT SCANNING APPARATUS

(71) Applicant: Kensuke Yamada, Tokyo (JP)

(72) Inventor: Kensuke Yamada, Tokyo (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 88 days.

(21) Appl. No.: 17/201,088

(22) Filed: Mar. 15, 2021

(65) Prior Publication Data

US 2021/0199951 A1   Jul. 1, 2021

Related U.S. Application Data

(62) Division of application No. 16/292,964, filed on Mar. 5, 2019, now abandoned.

(30) Foreign Application Priority Data

Mar. 22, 2018 (JP) ................. 2018-054572

(51) Int. Cl.
| | |
|---|---|
| G02B 26/08 | (2006.01) |
| H02N 2/04 | (2006.01) |
| H02N 2/06 | (2006.01) |
| G02B 26/10 | (2006.01) |

(52) U.S. Cl.
CPC ......... *G02B 26/0858* (2013.01); *G02B 26/10* (2013.01); *H02N 2/046* (2013.01); *H02N 2/065* (2013.01)

(58) Field of Classification Search
CPC .. G02B 26/0858; G02B 26/10; G02B 26/101; G02B 26/0833; G02B 26/105; H02N 2/046; H02N 2/065; H01L 41/0953; H01L 41/042; B81B 3/0045; B81B 2201/042; B81B 2203/0163; B81B 3/0083; B81B 3/0086; B81B 2203/04
See application file for complete search history.

(56) References Cited

U.S. PATENT DOCUMENTS

| | | | |
|---|---|---|---|
| 6,995,896 B2 | 2/2006 | Yamabana et al. | |
| 8,964,273 B2 | 2/2015 | Horie et al. | |
| 2009/0059193 A1 | 3/2009 | Tanaka | |
| 2012/0242191 A1 | 9/2012 | Aimono | |
| 2013/0258432 A1* | 10/2013 | Aimono | G02B 26/10 359/200.8 |

FOREIGN PATENT DOCUMENTS

| | | |
|---|---|---|
| JP | 2004-361920 | 12/2004 |
| JP | 2012-055852 | 3/2012 |
| JP | 2013-186145 | 9/2013 |
| JP | 2016-001325 | 1/2016 |

* cited by examiner

*Primary Examiner* — Kimberly N. Kakalec
(74) *Attorney, Agent, or Firm* — IPUSA, PLLC

(57) ABSTRACT

An actuator including a beam configured to support an object to be driven, and a drive source to which a drive signal is input, wherein the drive signal includes a drive waveform in a shape of sawtooth waveform, a rising of the drive waveform in the shape of sawtooth waveform includes a first staircase waveform and a second staircase waveform continuing from the first staircase waveform, the first staircase waveform generates oscillation of a ringing suppressing waveform for suppressing a ringing waveform to be generated in the second staircase waveform, and the object to be driven is driven to swing in a direction of rotating around the predetermined axis by driving the drive source.

8 Claims, 6 Drawing Sheets

ACTUATOR AND LIGHT SCANNING APPARATUS

CROSS-REFERENCE TO RELATED APPLICATIONS

This patent application is a divisional application of and claims the benefit of priority under 35 U.S.C. 120 to patent application Ser. No. 16/292,964 filed on Mar. 5, 2019, which is based upon and claims priority to Japanese Patent Application No. 2018-054572 filed on Mar. 22, 2018, the entire contents of which are incorporated herein by reference.

BACKGROUND OF THE INVENTION

1. Field of the Invention

The present invention relates to an actuator and a light scanning apparatus.

2. Description of the Related Art

Conventionally, an example of the light scanning apparatus is structured to rotate a mirror for reflecting incident light around a rotation axis using an actuator having a drive source of a piezoelectric element including an upper electrode on its upper surface and a lower electrode on its lower surface so as to scan reflected light. In this actuator, upper wiring connected to the upper electrode and lower wiring connected to the lower electrode are formed so as to apply voltage to the piezoelectric thin film (for example, see Patent Documents 1 and 2).

In the above light scanning apparatus, because the drive source is applied with a sawtooth voltage having a staircase waveform, ringing may occur due to resonant oscillation occurring when the mirror is driven. When the ringing occurs, an image formed by scanning the light scanning apparatus may be degraded.

In Patent Document 3, a feedback control is performed such that a deflection angle caused when the sawtooth waveform is input is subjected to sensing and the frequency filter is applied to a drive waveform so as to eliminate the ringing component.

In Patent Document 4, a drive waveform obtained by applying a filter for removing a resonance frequency component from a known frequency component is input.

Patent Document 1: Japanese Laid-open Patent Application Publication No. 2016-1325
Patent Document 2: Japanese Patent No. 5876329
Patent Document 3: Japanese Laid-open Patent Application Publication No. 2012-55852
Patent Document 4: Japanese Laid-open Patent Application Publication No. 2004-361920

SUMMARY OF THE INVENTION

When a method of applying a frequency filter to an entire drive waveform is used as described above, there exists a problem that a necessary straight line section may not be obtained because a stair becomes dull in a case where a sawtooth waveform whose main scan section is like a stair. Although the method of applying the filter is effective for sawtooth waveforms continuously repeated, an appropriate ringing suppressing effect is not obtainable in a case where the frequency of sawtooth waveform varies, or a case where a waiting time irregularly occurs between different cycles of the sawtooth waveform.

The present invention is provided in consideration of the above points. The objects of an embodiment of the present invention are that ringing occurring individually in a main scan section of sawtooth waveform is enabled to be suppressed without suppressing the entire sawtooth waveform regardless of waveform other than the waveform of the main scan section.

According to an embodiment, there is provided a method for driving an object to be driven using an actuator including a beam configured to support the object to be driven, and a drive source. The method includes generating a first staircase waveform that is oscillation of a ringing suppressing waveform for suppressing a ringing waveform to be generated, generating a second staircase waveform that causes the ringing waveform to occur, the second staircase waveform continuing from the first staircase waveform, generating a drive signal, the drive signal combining the first staircase waveform and the second waveform so as to have a shape of sawtooth waveform in a rising of a drive waveform, and driving the object to be driven with the drive source so as to swing in a direction of rotating around a predetermined axis while suppressing the ringing waveform.

The reference symbols in the above case arcs are attached to facilitate understanding only as an example. Of course, the present invention is not limited to what readable with the above mode illustrated in figures.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF EMBODIMENTS

Hereinafter, embodiments of the present invention are explained with reference to accompanying drawings. The same reference symbols are attached to the same parts, and repeated description of the parts may be omitted in the accompanying drawings.

EMBODIMENTS

Figure 1A:
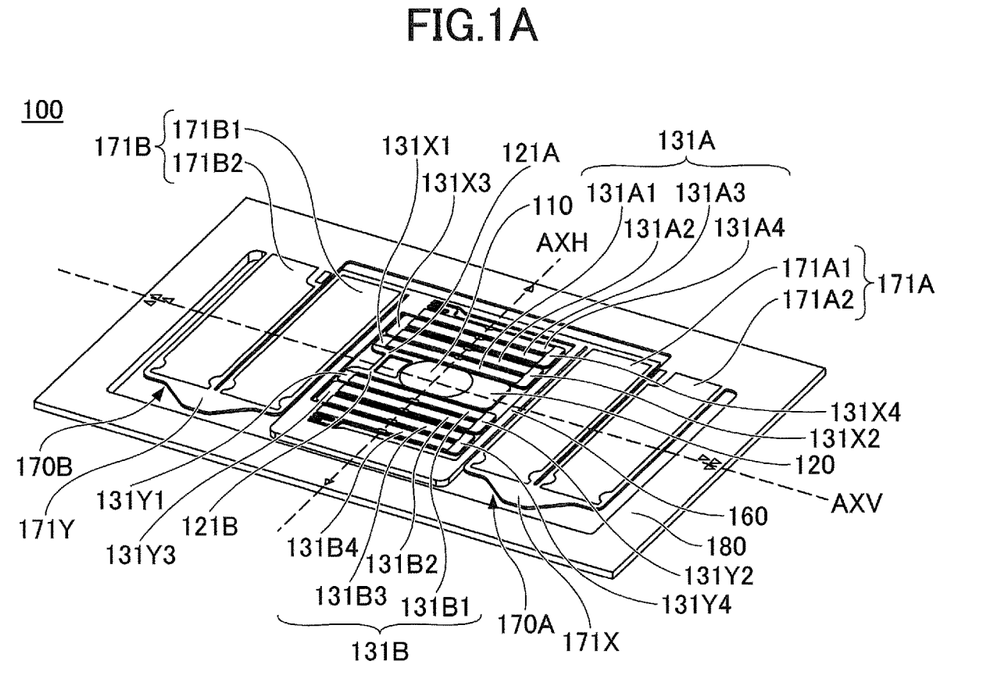
FIG. 1A is a perspective view of an example of a light scanning apparatus of the embodiment on an upper surface side.
Figure 1B:
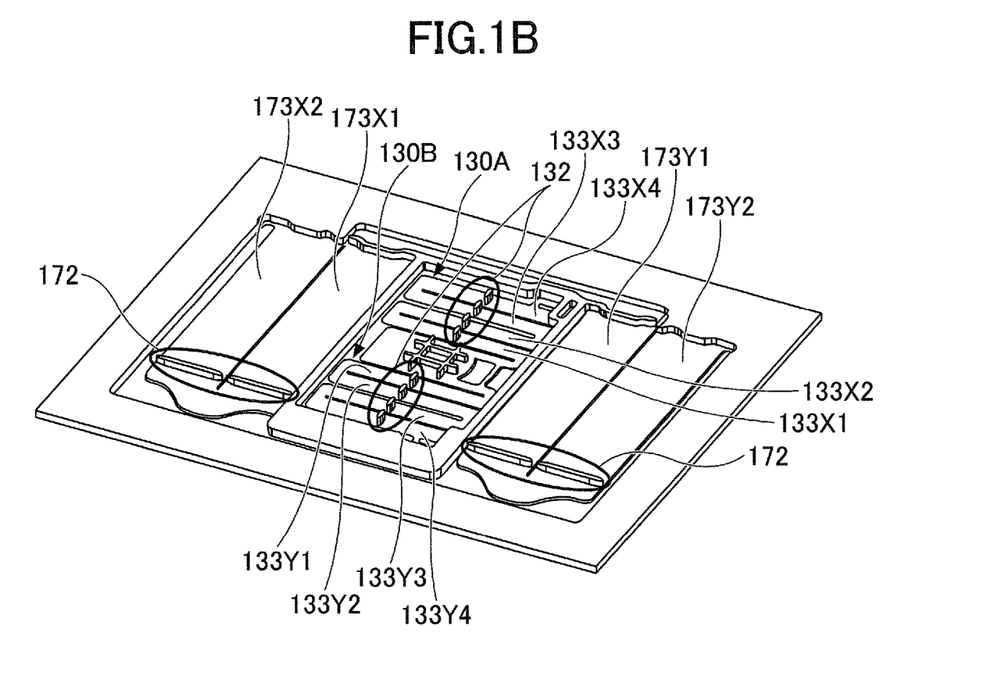
FIG. 1B is a perspective view of an example of the light scanning apparatus of the embodiment on a lower surface side.
Figure 2:
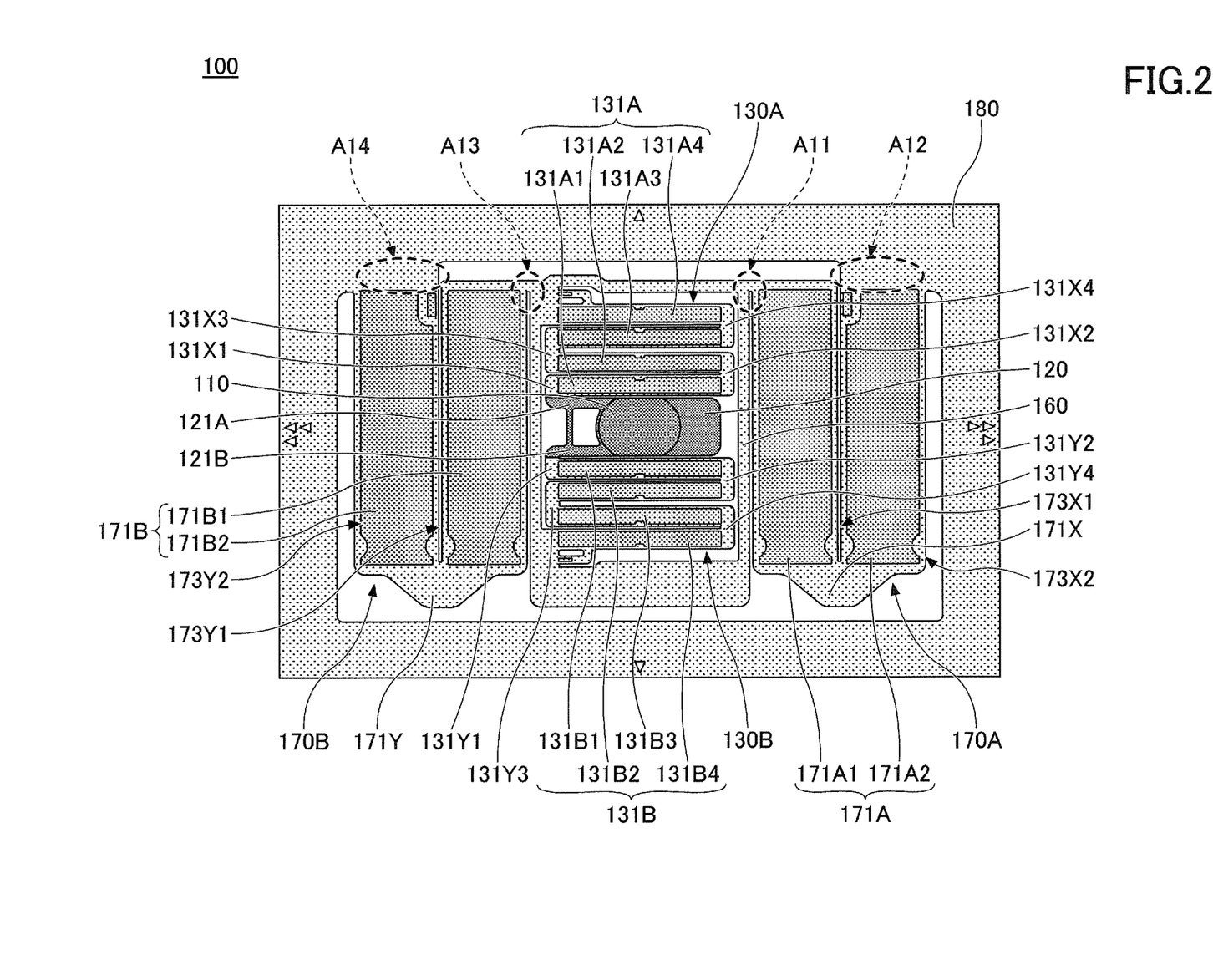
FIG. 2 is a plan view of an example of a light scanning part of the light scanning apparatus of the embodiment on the upper surface side.

FIG. 1A is a perspective view of an example of a light scanning apparatus of the embodiment on an upper surface side. FIG. 1B is a perspective view of an example of the light scanning apparatus of the embodiment on a lower surface side. FIG. 2 is a plan view of an example of a light scanning part of the light scanning apparatus of the embodiment on the upper surface side. The light scanning part 100 can be used by installing in a package member such as a ceramic package and a package cover.

The light scanning part 100 scans using laser incident light emitted from a light source while swinging the mirror 110. The light scanning part 100 is, for example, a MEMS mirror for driving the mirror 110 by a drive source, which is a piezoelectric element. The laser incident light is input into the mirror 110 provided in the light scanning part 100, and light exiting from the mirror 110 is bidimensionally scanned.

As illustrated in FIGS. 1A, 1B, and 2, the light scanning part 100 includes the mirror 110, a mirror supporting portion 120, connection beams 121A and 121B, horizontal drive beams 130A and 130B, a movable frame 160, vertical drive beams 170A and 170B, and a fixed frame 180. The mirror 110 is supported on the upper surface of the mirror supporting portion 120.

A pair of the horizontal drive beams 130A and 130B is disposed on both sides of the mir0 of supporting the mirror so as to be connected to the mirror supporting portion 120. The pair of the horizontal drive beams 130A and 130B supports the mirror 110 and the mirror supporting portion 120. The mirror supporting portion 120 and the horizontal drive beams 130A and 130B are connected by the connection beams 121A and 121B. The horizontal drive beams 130A and 130B, the connection beams 121A and 121B, the mirror supporting portion 120, and the mirror 110 are supported from the outside by the movable frame 160. The horizontal drive beam 130A includes multiple rectangular horizontal beams 133X1, 133X2, 133X3, and 133X4, which extend in the direction of the vertical rotation axis AXV perpendicular to the horizontal rotation axis AXH. The ends of the adjacent horizontal beams are respectively connected by the turnbacks 131X2, 131X3, and 131X4 so as to have a zig-zag like meandering structure as a whole. One end of the horizontal drive beam 130A is connected to an inner peripheral side of the movable frame 160, the other end of the horizontal drive beam 130A is connected to the mirror supporting portion 120 through the turnback 131X1 and the connection beam 121A. The horizontal drive beam 130B includes multiple rectangular horizontal beams 133Y1, 133Y2, 133Y3, and 133Y4, which extend in the direction of the vertical rotation axis AXV perpendicular to the horizontal rotation axis AXH. The ends of the adjacent horizontal beams are respectively connected by the turnbacks 131Y2, 131Y3, and 131Y4 so as to have a zig-zag like meandering structure as a whole. One end of the horizontal drive beam 130B is connected to an inner peripheral side of the movable frame 160, the other end of the horizontal drive beam 130B is connected to the mirror supporting portion 120 through the turnback 131Y1 and the connection beam 121B.

A pair of vertical drive beams 170A and 170B are connected to the movable frame 160 on both sides of the movable frame 160. The vertical drive beam 170A includes multiple rectangular vertical beams 173X1 and 173X2 extending in the horizontal rotation axis AXH. The ends of the adjacent vertical beams are connected by a turnback 171X so as to have a zig-zag like meandering structure as a whole. One end of the vertical drive beam 170A is connected to an inner peripheral side of the fixed frame 180, and the other end of the vertical drive beam 170A is connected to an outer peripheral side of the movable frame 160. The vertical drive beam 170B includes multiple rectangular vertical beams 173Y1 and 173Y2 extending in the horizontal rotation axis AXH. The ends of the adjacent vertical beams are connected by a turnback 171Y so as to have a zig-zag like meandering structure as a whole. One end of the vertical drive beam 170B is connected to an inner peripheral side of the fixed frame 180, and the other end of the vertical drive beam 170B is connected to an outer peripheral side of the movable frame 160.

The horizontal drive beams 130A and 130B respectively include horizontal drive sources 131A and 131B, which are piezoelectric elements. The vertical drive beams 170A and 170B respectively include the vertical drive sources 171A and 171B, which are piezoelectric elements. The horizontal drive beams 130A and 130B and the vertical drive beams 170A and 170B function as actuators which drive the mirror 110 to swing up and down and right and left for scanning a laser beam.

The horizontal drive sources 131A and 131B are formed on the upper surfaces of horizontal drive beams 130A and 130B for each horizontal beam as a unit of rectangle without a curved portion. The horizontal drive source 131A is a piezoelectric element formed on an upper surface (front surface) of the horizontal drive beam 130A, and includes a piezoelectric thin film, an upper electrode formed on the piezoelectric thin film, and a lower electrode formed on the lower surface of the piezoelectric thin film. The horizontal drive source 131B is a piezoelectric element formed on an upper surface (front surface) of the horizontal drive beam 130B, and includes a piezoelectric thin film, an upper electrode formed on the piezoelectric thin film, and a lower electrode formed on the lower surface of the piezoelectric thin film.

The horizontal drive beams 130A and 130B transmit accumulation of up-and-down motion of the horizontal beams to the mirror supporting portions 120 by respectively applying drive voltages (drive signals) having waveforms mutually inverting in up and down direction relative to the central value to deviate an adjacent horizontal beam in the upper direction. Within the embodiment, the drive waveform has a shape of sawtooth waveform. The mirror 110 and the mirror supporting portion 120 are swung in the direction of rotating the horizontal rotation axis AXH by movement of the horizontal drive beams 130A and 130B. This swung direction is called the horizontal direction. The swing axis passing through the center of the light reflection surface of the mirror 110 is called the horizontal rotation axis AXH.

For example, non-resonant oscillation can be used for the horizontal drive performed by the horizontal drive beams 130A and 130B.

For example, the horizontal drive source 131A includes four horizontal drive sources 131A1, 131A2, 131A3, and 131A4 respectively formed on the first to fourth horizontal drive beams that form the horizontal drive beam 130A. Meanwhile, the horizontal drive source 131B includes four horizontal drive sources 131B1, 131B2, 131B3, and 131B4 respectively formed on the first to fourth horizontal drive beams that form the horizontal drive beam 130B. In this case, when the horizontal drive sources 131A1, 131B1, 131A3, and 131B3 are applied with the same drive waveform, and the horizontal drive sources 131A2, 131B2, 131A4, and 131B4 are applied with a drive waveform obtained by inverting the same drive waveform up and down relative to the central value of the same drive waveform. Thus, the mirror 110 and the mirror supporting portion 120 can be swung in the horizontal direction.

The vertical drive sources 171A and 171B are respectively formed on the upper surface of the vertical drive beams 170A and 170B for the vertical beams 173X1, 173X2, 173Y1, and 173Y2, which are units of rectangle without including a curved portion. The vertical drive source 171A is a piezoelectric element formed on an upper surface (front surface) of the vertical drive beam 170A, and includes a piezoelectric thin film, an upper electrode formed on the piezoelectric thin film, and a lower electrode formed on the lower surface of the piezoelectric thin film. The vertical drive source 171B is a piezoelectric element formed on an upper surface (front surface) of the vertical drive beam 170B, and includes a piezoelectric thin film, an upper electrode formed on the piezoelectric thin film, and a lower electrode formed on the lower surface of the piezoelectric thin film.

Drive voltages (drive signals) having waveforms mutually inverted in upward and downward directions relative to the central value of the drive waveforms are respectively applied to the vertical drive sources 171A and 171B, which are adjacent, so as to change a deformation amount of the adjacent vertical beams in the upward direction. Then, the vertical drive beams 170A and 170B transmit accumulation of up-and-down motion of each vertical beam to the movable frame 160. Within the embodiment, the drive waveform has a shape of sawtooth waveform. The mirror 110 and the mirror supporting portion 120 are swung in the direction orthogonal to the direction of the horizontal rotation axis AXH by movement of the vertical drive beams 170A and 170B. This swung direction is called the vertical direction. The swing axis passing through the center of the light reflection surface of the mirror 110 is called the vertical rotation axis AXV. For example, the vertical drive by the vertical drive beams 170A and 170B may uses non-resonant oscillation.

For example, the vertical drive source 171A includes two vertical drive sources 171A1 and 171A2 respectively formed on first and second vertical beams 173X1 and 173X2, which forma vertical drive beam 170A. Meanwhile, the vertical drive source 171B includes two vertical drive sources 171B1 and 171B2 respectively formed on first and second vertical beams 173Y1 and 173Y2, which form a vertical drive beam 170B. In this case, because the same waveform is applied to the vertical drive sources 171A1 and 171B1, and a waveform obtained by inverting the same waveform relative to the central value of the same waveform is applied to the vertical drive sources 171A2 and 171B2, the movable frame 160 connected to the mirror 110 can be swung in the vertical direction.

A MEMS structure functioning as an actuator in the light scanning apparatus of the light scanning apparatus is made with an SOI substrate including a supporting layer, a buried oxide (BOX) layer, and an active layer. The above fixed frame 180 and the movable frame 160, and so on are formed of three layers, which are the supporting layer, the BOX layer, and the active layer. Meanwhile, a portion such as the horizontal drive beams 130A and 130B and the vertical drive beams 170A and 170B except for the fixed frame 180, the movable frame 160, and so on is formed by a single layer of the active layer. Alternatively, this portion may be firmed by two layers of the BOX layer and the active layer.

In the light scanning apparatus of the embodiment, the horizontal drive sources 131A and 131B are formed on one surface (the upper surface) of the horizontal beam forming the horizontal drive beams 130A and 130B, and the ribs 132 are formed on the other surface (the back surface) of the horizontal beam along the horizontal rotation axis AXH, which is the central portion of the horizontal beam forming the horizontal drive beams 130A and 130B, as described above. The ribs are short in the longitudinal direction of the horizontal beam and long in the direction perpendicular to the longitudinal direction. These ribs formed on the other surface (the back surface) of the horizontal beam forming the horizontal drive beams 130A and 130B are provided to prevent the meandering structure from vibrating and breaking by oscillation and water flow used in dicing of a manufacturing step for the MEMS structure.

Further, in the light scanning apparatus of the embodiment, the vertical drive sources 171A and 171B are formed on one surface (the upper surface) of each of the vertical beam 173X1, 173X2, 173Y1, and 173Y2, which form the vertical drive beams 170A and 170B, as described above. The ribs 172 are formed on the other surfaces of the vertical beams 173X1, 173X2, 173Y1, and 173Y2. The position of the ribs 172 is 10% to 20% of the length of the vertical beams 173X1, 173X2, 173Y1, and 173Y2 from the connecting portions between the vertical beams 173X1, 173X2, 173Y1, and 173Y2 and the turnbacks 171X and 171Y. The ribs 172 are short in the longitudinal direction of the vertical beams 173X1, 173X2, 173Y1, and 173Y2, and long in a direction perpendicular to the longitudinal direction. By providing the rib 172 on the other surface (the back surface) of the vertical beam forming the vertical drive beams 170A and 170B, it is possible to prevent the vertical drive beams 170A and 170B from unnecessarily deflect in a direction (the width direction of the vertical beams 173X1, 173X2, 173Y1, and 173Y2) perpendicular to the upward deflection direction. Thus, a displacement amount in the thickness direction of the mirror supporting portion 120 can be restricted.

In the light scanning apparatus of the embodiment, a rib is formed on the back surface opposite to a surface having the mirror 110 in the mirror supporting portion 120. The rib formed on the back surface of the mirror supporting portion 120 is provided for the purpose of preventing the mirror supporting portion from unnecessarily deflect.

The rib 172 formed on the other surface (the back surface) of each vertical beams 173X1, 173X2, 173Y1, and 173Y2 forming the vertical drive beams 170A and 170B has the same height (thickness) as those of the fixed frame 180 and the movable frame 160. Said differently, in a case where the MEMS structure functioning as the actuator of the light scanning apparatus is formed with an SOI substrate, a rib 172 is made with the BOX layer and the supporting layer on the back surface of each vertical beam 173X1, 173X2, 173Y1, and 173Y2 made with the active layer. The horizontal beam forming the horizontal drive beams 130A and 130B is made with the active layer, and the rib 132 formed on the other surface (the back surface) of the horizontal beam is made with the BOX layer and the supporting layer. The mirror supporting portion 120 is made with the active layer, and the rib formed on the back surface of a surface, on which the mirror 110 is formed, is made with the BOX layer and the supporting layer. Instead of using the supporting layer of the SOI substrate, a stair may be formed by etching bulk silicon.

Figure 3:
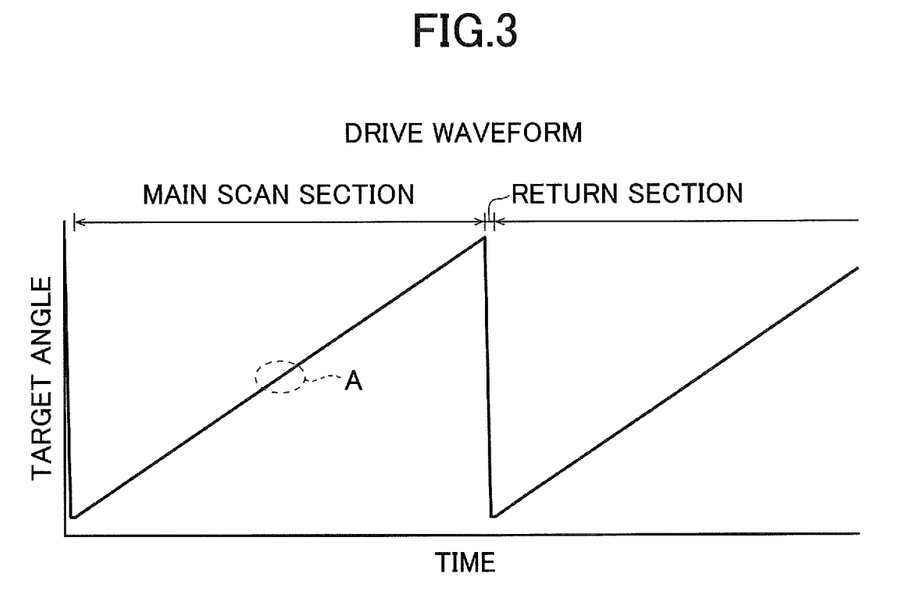
FIG. 3 illustrates an example of a drive waveform of a light scanning part of the light scanning apparatus of the embodiment.

FIG. 3 illustrates an example of a drive waveform of a light scanning part of the light scanning apparatus of the embodiment. For example, this drive waveform is that input into the vertical drive sources. The horizontal axis represents time, and the vertical axis represents a target angle of the mirror. As illustrated in FIG. 3, the drive waveform has a shape of sawtooth waveform. One cycle of this sawtooth waveform includes a main scan section and a return section. In the main scan section, the angle changes from an initial angle to an end angle and then from the end angle to the initial angle in accordance with a time change.

Figure 4:
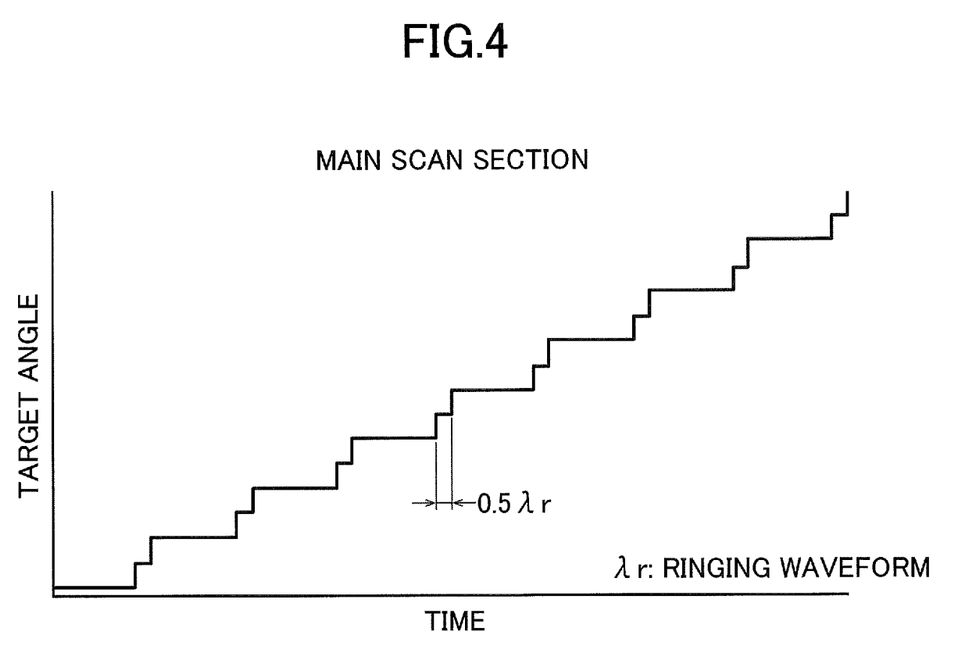
FIG. 4 is an enlarged view illustrating a main scanning section as a rising of an example of the drive waveform of the light scanning part of the light scanning apparatus of the embodiment.

FIG. 4 is an enlarged view illustrating the main scanning section as a rising of an example of the drive waveform of the light scanning part of the light scanning apparatus of the embodiment. FIG. 4 is an enlarged view of an area A1 illustrated in FIG. 3. The main scan section in the sawtooth waveform is shaped like stairs as illustrated in FIG. 4. This sawtooth waveform includes a first staircase waveform and a second staircase waveform continuing from the first staircase waveform, and the height of the first staircase waveform and the height of the second staircase waveform relative to the first staircase waveform are substantially the same. The first staircase waveform has a length which is ½ (0.5λr) of a ringing wavelength λr.

Said differently, in a stair of a set of stairs including the first staircase waveform and the second staircase waveform, displacements occur twice at a time interval of ½ of a ringing wavelength λr. At this time, as described later, the first staircase waveform may generate a ringing suppressing waveform, which is a ringing waveform having an inverted phase of a ringing waveform generated in the second staircase waveform. Said differently, ringing generated in the first staircase waveform and ringing generated in the second staircase waveform mutually cancel. Detailed explanation of the cancellation of the ringing between the first staircase waveform and the second staircase waveform will be given later.

Figure 5:
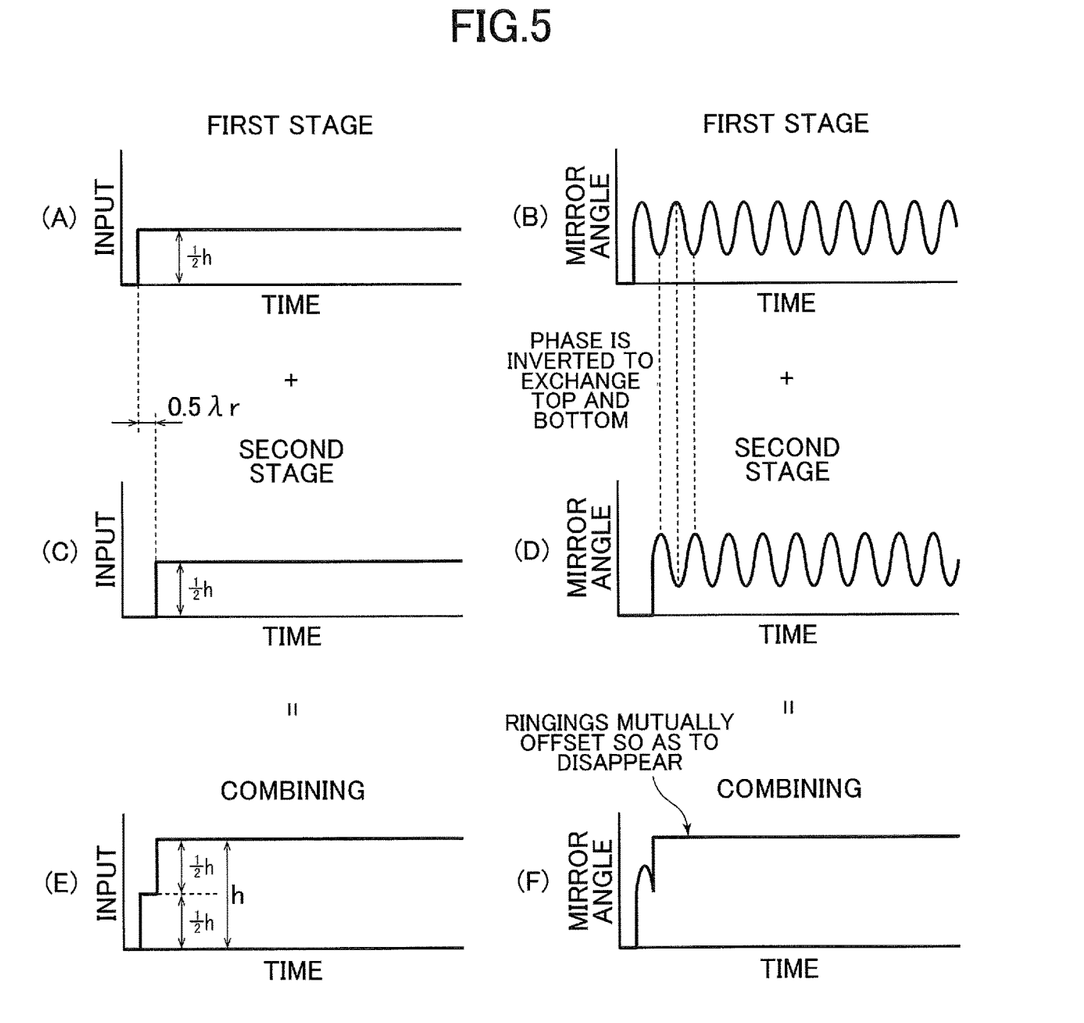
FIG. 5 illustrates mirror angle waveforms corresponding to input waveforms of an example of the drive waveform of a light scanning part of the light scanning apparatus of the embodiment.

FIG. 5 illustrates mirror angle waveforms corresponding to input waveforms of an example of the drive waveform of a light scanning part of the light scanning apparatus of the embodiment. In FIG. 5, (A) is an input waveform of the first staircase waveform. The height of the first staircase waveform is ½h. In FIG. 5, (B) illustrates the mirror angle obtained as a result of the input in (A) of FIG. 5. Ringing is generated after the mirror angle is displaced along the first staircase waveform. In FIG. 5, (C) is an input waveform of only the second staircase waveform without considering the first staircase waveform. The height of the second staircase waveform is ½h. The second staircase waveform rises 0.5λr later than the rise of the first staircase waveform. Said differently, the length of the first staircase waveform is 0.5λr. In FIG. 5, (D) illustrates the mirror angle obtained as a result of the input in (C) of FIG. 5. In FIG. 5, (D) is mirror angle considering only the second staircase waveform. In FIG. 5, the ringing is generated after the mirror angle is displaced along the second staircase waveform like (B). However, the waveform of (D) is later than the waveform of (B) the phase of 0.5λ.

The mirror is driven by a waveform obtained by adding the first staircase waveform and the second staircase waveform. In FIG. 5, (E) is obtained by adding (A) and (C). In FIG. 5, the height of the first staircase waveform of (A) is ½h, and the height of the second staircase waveform of (C) is ½h.

As in (E), by combining the first staircase waveform having the height ½h and the second staircase waveform having the height ½h, the waveform has the height h.

Said differently, the height of the first staircase waveform and the height of the second staircase waveform are substantially the same. Because the height of the first staircase waveform and the height of the second staircase waveform are substantially the same, the amplitude of the ringing waveform generate by the first staircase waveform and the amplitude of the ringing waveform generate by the second staircase waveform become the same as illustrated in (b) of FIG. 5.

In FIG. 5, (F) is the mirror angle indicating a result of the input illustrated in (E). (F) has a waveform obtained by adding (B) and (D). Here, the rising position of the first staircase waveform illustrated in (A) of FIG. 5 shifts from the rising position of the second staircase waveform illustrated in (C) of FIG. 5 by 0.5λr. Therefore, the phase of the ringing waveform in (B) and the phase of the ringing waveform in (D) are inverted so as to exchange top and bottom. By adding the ringing waveform in (B) and the ringing waveform in (D), these waveforms offset each other to cancel the ringing. As a result, as illustrated in (F) of FIG. 5, the waveform representing a flat mirror angle without ringing is obtainable. As described, the ringing waveform generated in the first staircase waveform has an effect of suppressing the ringing waveform generated in the second staircase waveform. Therefore, the ringing waveform generated in the first staircase waveform is also referred to as a ringing suppressing waveform. The above description of "the height of the first staircase waveform and the height of the second staircase waveform are substantially the same" means that the amplitude the ringing waveform generated by the first staircase waveform and the amplitude the ringing waveform generated by the second staircase waveform are in the same range to an extent that the ringing waveforms having a phase shift of 0.5λr can be offset so as to be mutually cancelled.

As described, the ringing suppressing waveform generated in the first staircase waveform and the ringing waveform generated in the second staircase waveform have the same amplitude and different phases. Accordingly, by combining the ringing waveform generated by the first staircase waveform and the ringing waveform generated by the second staircase waveform, these ringing waveforms are mutually canceled. Especially when the phase shift is 0.5λr, the positions of the top and bottom of each of the ringing waveforms are exactly inverted between the first staircase waveform and the second staircase waveform, it is possible to substantially eliminate the ringing.

The length of the first staircase waveform is described. When the length of the first staircase waveform is 0.5λr, the phase of the ringing suppressing waveform and the ringing waveform generated in the second staircase waveform can be exactly inverted. Said differently, the ringing waveform generated in the first staircase waveform and ringing generated in the second staircase waveform mutually cancel. In a case where the length of the first staircase waveform is 0.5λr, the phase shift is exactly inverted so as to maximize the effect of cancelling the ringing waveforms. However, if the length of the first staircase waveform is not 0.5λr and other than nλr (n is a positive integer), the phase shift occurs so as to mutually cancel the ringing waveform to a certain level. Thus, the ringing suppressing waveform generated in the first staircase waveform can cancel the ringing waveform generated in the second staircase waveform. However, if the length of the second staircase waveform is nλr (n is a positive integer), the ringing waveform generated in the first staircase waveform and the ringing waveform generated in the second staircase waveform mutually stress to disable an effect of suppressing the ringing components.

The first staircase waveform and the second staircase waveform are rendered to be a set, the drive waveform of the main scan section is formed to have multiple sets of the first staircase waveform and the second staircase waveform. The ringing waveforms in each set of the first staircase waveform and the second staircase waveform are offset so as to be canceled.

According to the embodiment, the rising of the drive waveform in the shape of sawtooth waveform includes the first staircase waveform and the second staircase waveform continuing from the first staircase waveform, the first staircase waveform generates oscillation of the ringing suppressing waveform for suppressing the ringing waveform to be generated in the second staircase waveform. Therefore, it is possible to suppress the ringing individually generated in the main scan section without relying on the waveform other than that belonging to the main scan section.

EXAMPLES

In a case where the mirror of the light scanning apparatus is displaced, a stair waveform may be used as a vertical drive waveform for displacing the mirror. If the stair waveform is simply used as an input waveform, f0 is strongly exited to generate the ringing. Further, if the transition time of the stair part of the vertical drive waveform, is longer than the return time of sawtooth waveform of the horizontal drive waveform, there occurs a waiting period in the horizontal drive to generate the ringing in the horizontal drive. Therefore, it is necessary that the transition time is shorter than the time (for example, about 2 milliseconds) for the return section. Further, the number of stairs is 512 stairs at most and the resolution per one stair is four stairs (the number of staircase waveforms which can be allocated to a set of staircase waveforms is four at most). Therefore, a smooth waveform like a return section of the horizontal drive waveform cannot be formed. The waveform satisfying these conditions and having suppressed ringing is considered.

Figure 6:
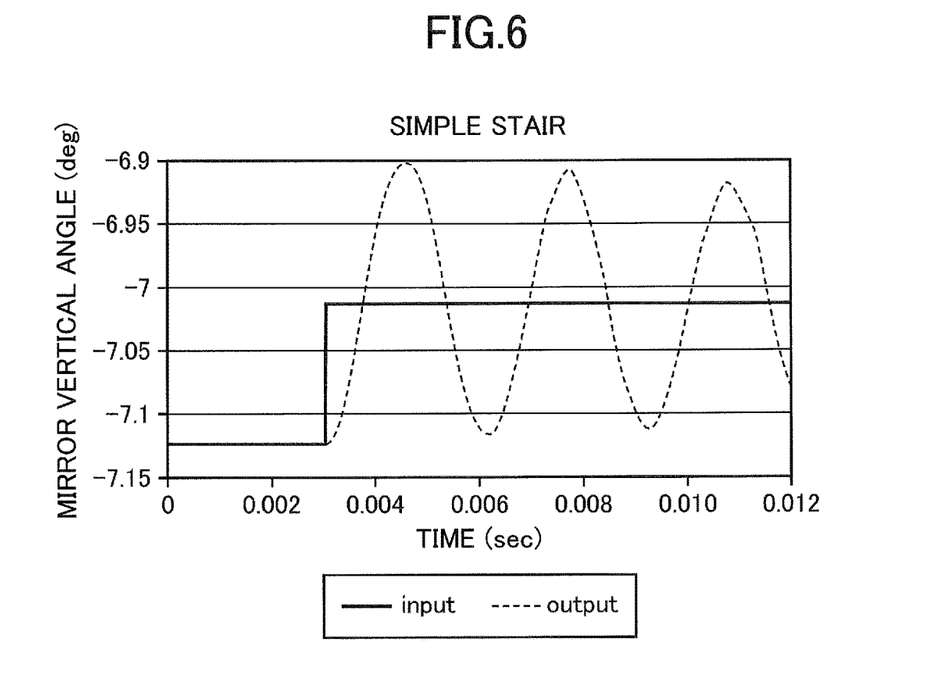
FIG. 6 illustrates an input waveform (input) and an output waveform (output) related to a mirror vertical angle in the main scan section of the light scanning part of the light scanning apparatus of a comparative example.

FIG. 6 illustrates an input waveform (input) and an output waveform (output) related to the mirror vertical angle in the main scan section of the light scanning part of the light scanning apparatus of a comparative example. The horizontal axis represents time, and the vertical axis represents the mirror vertical angle. This input waveform (input) of the comparative example has a shape of a simple stair, which is a single staircase waveform causing the angle of the mirror to be displaced by a predetermined angle. The input waveform in the main scan section is formed by a great number of the staircase waveforms. When the mirror is displaced using the single staircase waveform, the ringing is generated like the output waveform illustrated in FIG. 6. The transition time necessary for a rising in the staircase waveform is 0 second. Ringing having the amplitude being 190.15% of the height of the stair-like input waveform is generated in the output waveform. It takes at least 0.1 second until the ringing is settled.

Figure 7:
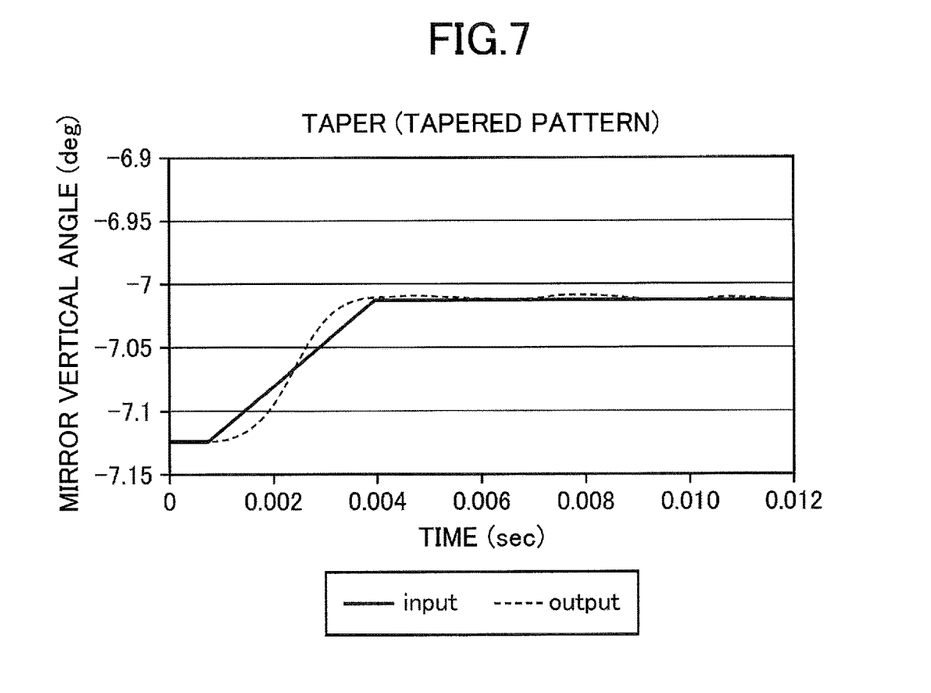
FIG. 7 illustrates an input waveform (input) and an output waveform (output) related to the mirror vertical angle in the main scan section of the light scanning part of the light scanning apparatus of a reference example 1.

FIG. 7 illustrates an input waveform (input) and an output waveform (output) related to the mirror vertical angle in the main scan section of the light scanning part of the light scanning apparatus of a reference example 1. The horizontal axis represents time, and the vertical axis represents the mirror vertical angle. The input waveform (input) of the reference 1 is in a shape of a taper, with which a predetermined angle is displaced during a predetermined time. The input waveform in the main scan section is formed by a great number of taper-like waveforms. When the mirror is displaced using one taper waveform, the ringing can be strongly suppressed like the output waveform illustrated in FIG. 7. The transition time necessary for the rising of the taper-like waveform is 3.16 milliseconds. The amplitude of the ringing in the output waveform is 2.58% of the height of the staircase waveform of the input waveform. By making the transition time of the taper a multiple number of the ringing wavelength, the ringing can be suppressed. Because the oscillation of f0 is dominant in the ringing, in the reference example, the wavelength of f0 is made 3.16 milliseconds. Although the ringing is substantially reduced, it is very difficult to make a clear taper waveform in a logic circuit.

Figure 8:
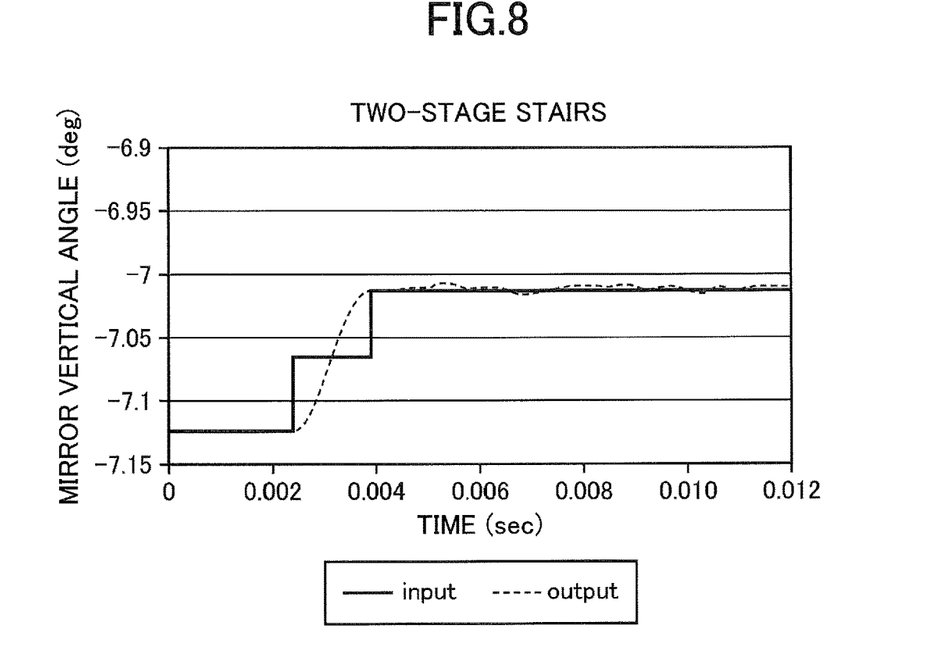
FIG. 8 illustrates an input waveform (input) and an output waveform (output) related to the mirror vertical angle in the main scan section of the light scanning part of the light scanning apparatus of an example.

FIG. 8 illustrates an input waveform (input) and an output waveform (output) related to the mirror vertical angle in the main scan section of the light scanning part of the light scanning apparatus of an example. The horizontal axis represents the time, and the vertical axis represents the mirror vertical angle. The input waveform (input) of the example has a two-stage staircase waveform, in which a predetermined angle is displaced using a set of a first staircase waveform and a second staircase waveform. Each of the first staircase waveform and the second staircase waveform displaces 50% of the predetermined angle. Further, the input waveform of the main scan section is formed by a large number of these sets of the first staircase waveform and the second staircase waveform. As illustrated in FIG. 5, when the mirror is displaced using the set of two-stage staircase waveforms, the ringing is strongly suppressed as the output waveform illustrated in FIG. 8. The transition time corresponding to an interval between the first staircase waveform and the second staircase waveform is 1.58 milliseconds. The ringing having the amplitude of 7.63% of the sum of the heights of the two stage staircase waveform of the input waveform is generated in the output waveform. Here, the staircase waveforms having the same height are arranged with a time interval (0.5λr) which is a half of the ringing frequency. The first staircase waveform generates a ringing suppressing waveform being oscillation that can suppress a ringing waveform to be generated by the second staircase waveform so as to offset the ringing. Because this two stage staircase waveform has a short transition time and a staircase waveform, this two stage staircase waveform can be easily produced using a logic circuit.

Figure 9:
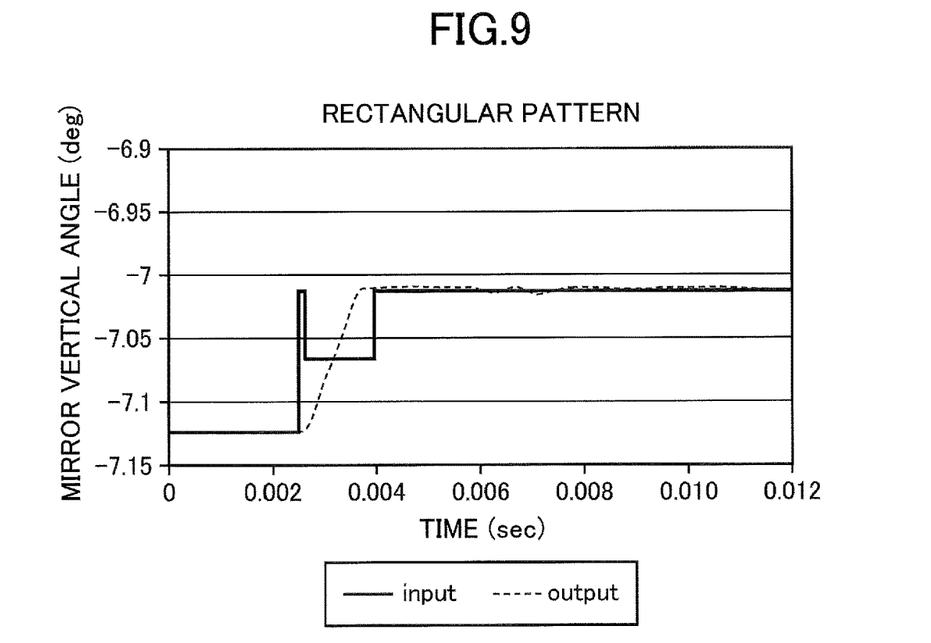
FIG. 9 illustrates an input waveform (input) and an output waveform (output) related to the mirror vertical angle in the main scan section of the light scanning part of the light scanning apparatus of a reference example 2.

FIG. 9 illustrates an input waveform (input) and an output waveform (output) related to the mirror vertical angle in the main scan section of the light scanning part of the light scanning apparatus of a reference example 2. The horizontal axis represents the time, and the vertical axis represents the mirror vertical angle. The input waveform (input) of the reference example 2 has a shape of a rectangular pattern. After displacing the mirror by a predetermined angle in first rising, 50% of this displacement is reduced after a passage of 0.11 milliseconds. Further, the reduced 50% displacement is increased after a passage of 1.37 milliseconds by second rising. Through the first rising and the second rising, the displacements of the mirror is totally displaced by the predetermined angle. The input waveform of the main scan section is formed by a large number of sets of waveforms from the first rising to the second rising. When the mirror is displaced using this one set of rectangular waveform, the ringing can be strongly suppressed like the output waveform illustrated in FIG. 9. The transition time corresponding to an interval between a first rising form and a second rising form is 1.48 milliseconds. The ringing having the amplitude of 5.83% of the sum of the displacements of the first rising and the second rising is generated in the output waveform. A time between the first rising of the predetermined angle to the reducing of the predetermined ratio of the predetermined angle, a time between the reducing of the predetermined ratio of the predetermined angle and the second rising, and the predetermined ratio of the predetermined angle are used as three parameters to enable adjustments of reducing the ringing. By this combination of the first rising and the second rising, it is assumed that the ringing other than f0 is canceled. However, the relation between the parameter and the offset frequency is unclear.

Although the invention has been described with respect to specific embodiments for a complete and clear disclosure, the appended claims are not to be thus limited but are to be construed as embodying all modifications and alternative constructions that may occur to one skilled in the art that fairly fall within the basic teachings herein set forth. For example, the above embodiment describes a mode in which the actuator is applied to the light scanning apparatus including the mirror. However, the object to be driven may not be the mirror, and the present invention may be applicable to an actuator without having a mirror. Further, the above embodiment describes a mode in which the actuator is of the piezoelectric drive type, whose drive source is the piezoelectric thin film. However, the present invention may be applicable to an actuator using the other type such as an electromagnetic drive type and an electrostatic drive type. Further, the light scanning apparatus may be preferably applied to an optical coherence tomography of a funduscopic examination apparatus. In the optical coherence tomography of the funduscopic examination apparatus, one of two axes performs a high speed operation like a projector so as not to necessitate a resonance drive. Further, because optical scanning of freely setting and adjusting a deflection angle amount is required, the two axes are preferably of a non-resonance drive type. Further, the embodiment is applicable to a projection apparatus.

According to the described technique, a drive signal includes a drive waveform in a shape of sawtooth waveform, a rising of the drive waveform in a shape of sawtooth waveform includes a first staircase waveform and a second staircase waveform continuing from the first staircase waveform, and the first staircase waveform generates oscillation of a ringing suppressing waveform for suppressing a ringing waveform to be generated in the second staircase waveform. Thus, ringing itself generated solely in a main scan section of the sawtooth waveform can be suppressed without entirely suppressing the sawtooth waveform regardless of a waveform other than a partial waveform in the main scan section.

Reference symbols typically designates as follows.
100: light scanning part;
110: mirror;
120: mirror supporting portion;
121A, 121B: connection beam;
130A, 130B: horizontal drive beam;
131A, 131B: horizontal drive source;
131A1, 131A2, 131A3, 131A4: horizontal drive source;
131B1, 131B2, 131B3, 131B4: horizontal drive source;
131X1, 131X2, 131X3, 131X4: turnback;
131Y1, 131Y2, 131Y3, 131Y4: turnback;
132: rib;
133X1, 133X2, 133X3, 133X4: horizontal beam;
133Y1, 133Y2, 133Y3, 133Y4: horizontal beam;
160: movable frame;
170A, 170B: vertical drive beam;
171A, 171B: vertical drive beam;
171A1, 171A2: vertical drive beam;
171B1, 171B2: vertical drive beam;
171X, 171Y: turnback;
172: rib;
173X1, 173X2, 173Y1, 173Y2: vertical beam; and
180: fixed frame.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the actuator has been described in detail, it should be understood that the various changes, substitutions, and alterations could be made hereto without departing from the spirit and scope of the invention.

What is claimed is:

1. A method for driving an object to be driven using an actuator including
a beam configured to support the object to be driven, and
a drive source, the method comprising:
generating a first staircase waveform that is oscillation of a ringing suppressing waveform for suppressing a ringing waveform to be generated;
generating a second staircase waveform that causes the ringing waveform to occur, the second staircase waveform continuing from the first staircase waveform;
generating a drive signal, the drive signal combining the first staircase waveform and the second staircase waveform so as to have a shape of sawtooth waveform in a rising of a drive waveform; and
driving the object to be driven with the drive source so as to swing in a direction of rotating around a predetermined axis while suppressing the ringing waveform.

2. The method for driving an object to be driven according to claim 1,
wherein the beam includes a plurality of beams extending in a direction vertical to the predetermined axis, and
adjacent ends of adjacent beams from among the plurality of beams are connected by a turnback so as to form a zigzag-like meandering structure as a whole.

3. The method for driving an object to be driven according to claim 1,
wherein the beam is a drive beam, on a front surface of which the drive source is formed, the beam being a drive beam configured to swing the object to be driven.

4. The method for driving an object to be driven according to claim 1,
wherein ringing generated by the first staircase waveform and ringing generated by the second staircase waveform mutually cancel.

5. The method for driving an object to be driven according to claim 1,
   wherein a height of the first staircase waveform and a height of the second staircase waveform are substantially same.

6. The method for driving an object to be driven according to claim 1,
   wherein a length of the first staircase waveform is other than n times of a ringing wavelength $\lambda r$ of ringing generated by the first staircase waveform where n is a positive integer.

7. The method for driving an object to be driven according to claim 6,
   wherein the length of the first staircase waveform is 0.5 $\lambda r$.

8. The method for driving an object to be driven according to claim 1,
   wherein a rising section of the sawtooth waveform is a main scan section of scanning by the actuator.

* * * * *